United States Patent
Bor

(10) Patent No.: US 7,283,575 B2
(45) Date of Patent: Oct. 16, 2007

(54) NARROW BAND ELECTRIC DISCHARGE GAS LASER HAVING IMPROVED BEAM DIRECTION STABILITY

(75) Inventor: Zsolt Bor, Szeged (HU)

(73) Assignee: Cymer, Inc., San Diego, CA (US)

( * ) Notice: Subject to any disclaimer, the term of this patent is extended or adjusted under 35 U.S.C. 154(b) by 343 days.

(21) Appl. No.: 10/762,119

(22) Filed: Jan. 20, 2004

(65) Prior Publication Data

US 2004/0184503 A1    Sep. 23, 2004

Related U.S. Application Data

(60) Division of application No. 10/202,351, filed on Jul. 23, 2002, now Pat. No. 7,203,217, which is a division of application No. 09/637,103, filed on Aug. 10, 2000, now abandoned, which is a continuation-in-part of application No. 09/490,835, filed on Jan. 25, 2000, now Pat. No. 6,317,447.

(51) Int. Cl.
*H01S 3/22* (2006.01)

(52) U.S. Cl. .......................................... 372/55; 372/57

(58) Field of Classification Search .................. 372/55, 372/57

See application file for complete search history.

(56) References Cited

U.S. PATENT DOCUMENTS

| | | | |
|---|---|---|---|
| 3,775,700 A | 11/1973 | Garman et al. | 331/94.5 |
| 4,607,341 A | 8/1986 | Monchelin | 364/557 |
| 4,656,639 A | 4/1987 | Suhre | 372/83 |
| 4,710,938 A | 12/1987 | Fuke et al. | 372/56 |
| 4,940,333 A | 7/1990 | Pawliszyn | 356/432 |
| 5,191,374 A | 3/1993 | Hazama et al. | 355/43 |
| 5,247,537 A | 9/1993 | Kaiser et al. | 372/107 |
| 5,404,366 A | 4/1995 | Wakabayashi et al. | 372/29 |
| 5,852,621 A | 12/1998 | Sandstrom | 372/25 |
| 5,991,324 A * | 11/1999 | Knowles et al. | 372/57 |

(Continued)

*Primary Examiner*—Dung (Michael) T. Nguyen
(74) *Attorney, Agent, or Firm*—William Cray

(57) ABSTRACT

An electric discharge, narrow band gas laser with improvements in wavelength stability. Improvements result from reduced laser beam directional fluctuations or fast correction of those fluctuations. Applicant has discovered, using an extremely sensitive knife edge optical technique, that gas discharge laser windows in a trapezoidal configuration were causing slight wavelength perturbations when laser gas density varied during laser operation. The optical technique involves using test laser beam directed through the discharge region of the gas discharge laser, blocking a portion of the beam with a knife edge and measuring the non-blocked portion of the beam to monitor beam deflection. With this technique, Applicant can measure beams deflection with an accuracy of about 0.3 microradians and with a time response of about 1 microsecond. An improvement in wavelength stability is achieved by orienting the laser chamber windows parallel to each other at a selected angle between 40° and 70° with the laser beam direction. The change eliminates wavelength fluctuations caused by laser beam direction fluctuation caused pressure fluctuations and the prism effect resulting from windows mounted in a prior art trapezoidal configuration. Beam directional fluctuations can also be measured during laser operation using the knife edge technique or similar fast response techniques such as a quadrant detector and the measured values can be used in a feedback arrangement along with fast wavelength control unit to compensate for changes in beam direction. In addition techniques for reducing the causes of beam direction fluctuations are disclosed. These include techniques for minimizing the effects of laser discharge caused pressure waves.

31 Claims, 14 Drawing Sheets

U.S. PATENT DOCUMENTS

| | | |
|---|---|---|
| 6,005,879 A | 12/1999 | Sandstrom et al. ............ 372/25 |
| 6,034,978 A | 3/2000 | Ujazdowski et al. .......... 372/34 |
| 6,181,724 B1 | 1/2001 | Tanaka et al. ................. 372/57 |
| 6,603,788 B1 | 8/2003 | Vogler et al. .................. 372/57 |
| 6,813,004 B1 * | 11/2004 | Horikoshi et al. ............. 355/69 |

* cited by examiner

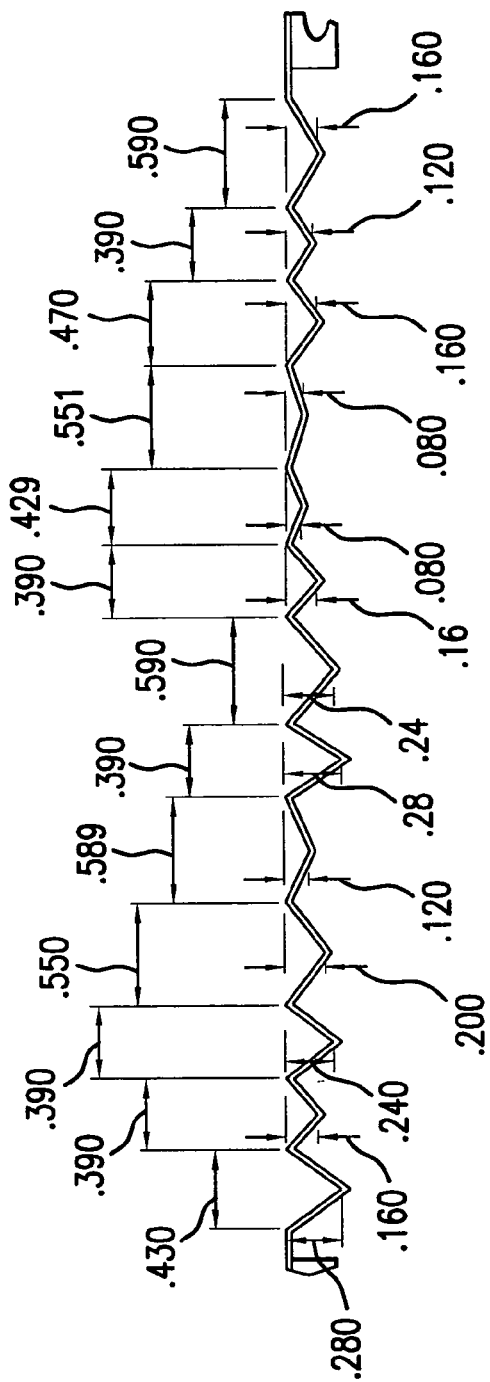
FIG. 11B1
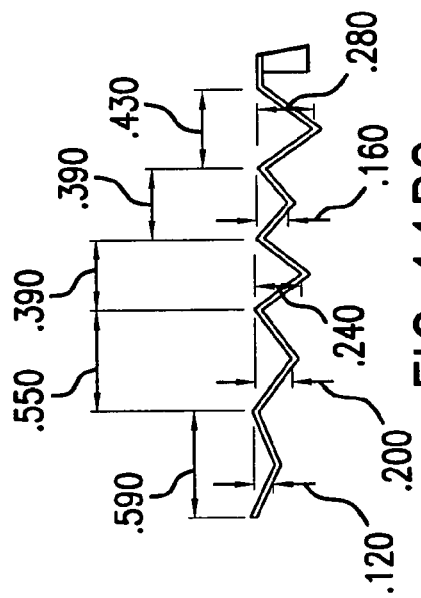
FIG. 11B2

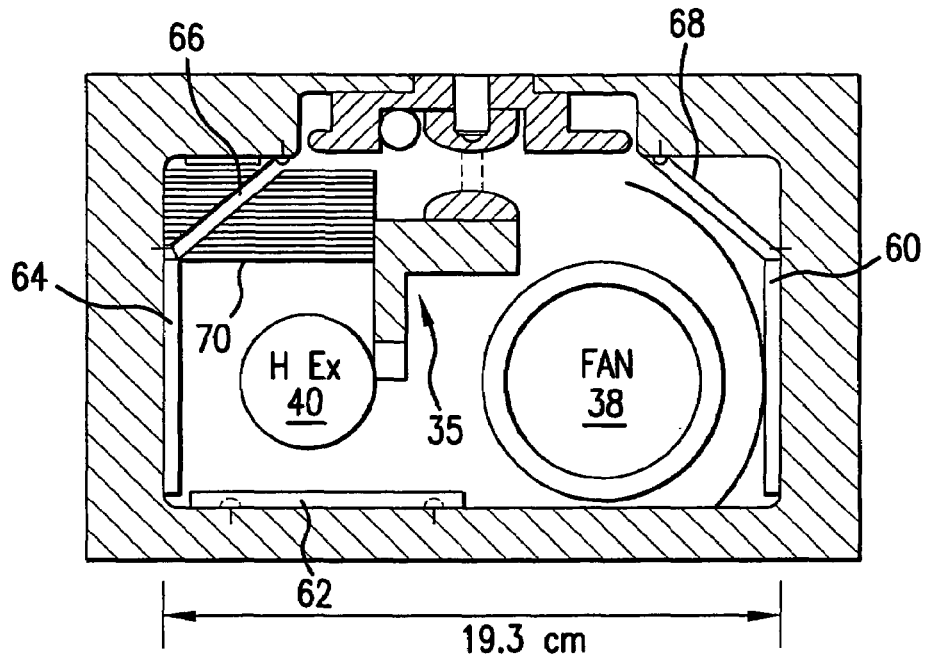
FIG. 11D1
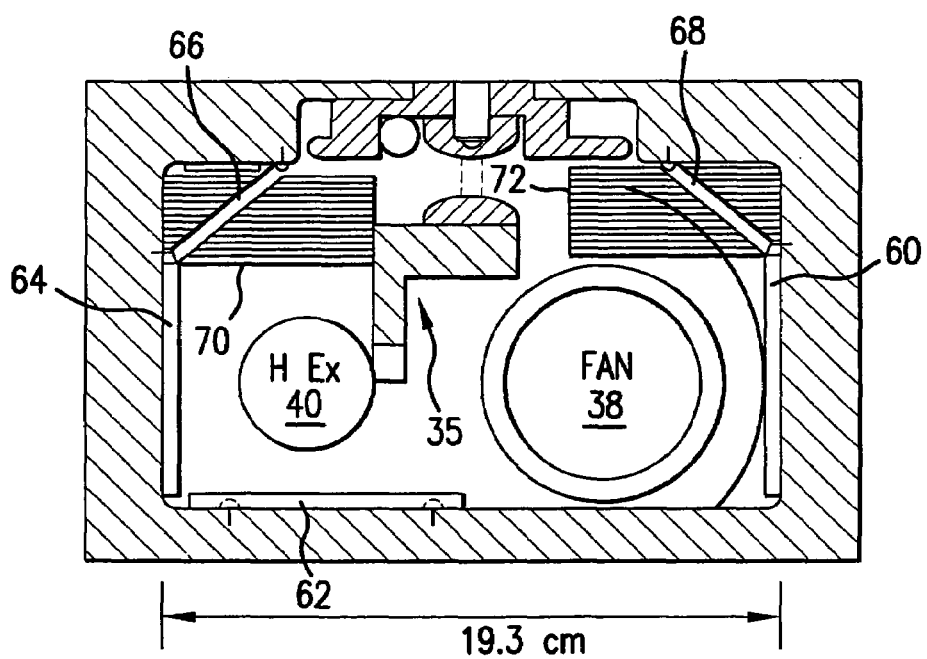
FIG. 11D2

NARROW BAND ELECTRIC DISCHARGE GAS LASER HAVING IMPROVED BEAM DIRECTION STABILITY

This invention is a continuation-in-part of Ser. No. 09/490,835 filed Jan. 25, 2000 now U.S. Pat No. 6,317,447. This invention relates to gas discharge lasers and especially to narrow band, high pulse rate electric discharge gas lasers with rapidly circulating laser gas and to methods of testing and of stabilizing laser beam direction in such lasers.

BACKGROUND OF THE INVENTION

Gas lasers typically contain a laser gas contained in a laser chamber. Normally two windows are provided for a laser beam to pass into and out of the chamber. These windows may be positioned normal to the laser axis or they may be positioned at various angles with respect to the beam axis. If the mirrors are normal to the laser beam axis the beam will suffer about 4% reflection loss at each window-gas interface and reflection from windows in the normal position may be detrimental to the laser gain and energy stability. By tilting the windows, even slightly, reflection caused problems can be reduced. By tilting the windows to the Brewer's angle (typically about 57°), the windows will have virtually 100% transmission for light whose electric component is parallel to the plane of incidence (defined by the beam axis and a normal to the window surface at the intersection of the beam axis and the window surface) see FIG. 1 at 7A and 7B. At angles smaller or larger than the Brewster's angle transmission of the parallel component is reduced by an amount dependent on the amount of deviation from the Brewster's angle.

As shown in FIG. 1, having both windows tilted at angles parallel to each other produces an offset due to the lateral displacement of the beam in the same direction in both windows. This complicates the alignment of the front and rear laser optics especially for large gas discharge lasers laser systems which typically are assembled from separate modules which are mounted separately on a laser frame. Therefore, in prior art gas discharge lasers with tilted windows, the windows are tilted in opposite directions as shown in FIG. 2 at 7C and 7D. This produces a "trapezoidal" shaped beam path. This arrangement of the mirrors also makes inspection of the windows for damage relatively easy since both windows can be viewed from the front of the chamber where doors to the laser cabinet are typically located. FIG. 2 describes a prior art exciter laser system used as the light source for integrated circuit fabrication. In this system, the laser chamber, the rear optic and the front optic are each separate modules mounted separately on the frame of the laser system.

The rear optic is a line narrowing module (typically called a line narrowing package or LNP) 2 and the front optic is an output coupler module 4. The laser chamber 6 can be removed from the front of the laser system and replaced or realigned without disturbing either the front or the rear optics and without significantly affecting the optical alignment. This is because the offset caused by one of the windows is cancelled by the other window. The LNP includes a three-prism beam expander 8, a tuning mirror 10 and a grating 12 positioned in a Littrow configuration.

FIG. 3 is a cross-sectional sketch of laser chamber 6 shown in FIG. 2. The chamber in addition to the laser gas contains elongated cathode 36A, elongated anode 36B, preionizer tube 46, insulator 42, anode support bar 35, heat exchanger 40 and tangential fan 38 for circulating the laser gas fast enough to clear discharge region 34 between successive pulses. For a 2,000 Hz pulse rate, this requires a gas velocity between the electrodes of about 30 m/s (about 67 miles/hour).

In this prior art laser system which typically operates at pulse repetition rates of 1000 to 2000 Hz, both the pulse energy and the wavelength are controlled with feedback control systems in which each laser pulse is monitored by power and wave meter 14 and the measured values are used by controller 16 to control the energy and wavelength of subsequent pulses based on measured values of pulse power and wavelength. Pulse energy control is achieved by controlling the charge on a charging capacitor bank in pulse power system 18 and the wavelengths of subsequent pulses are controlled by automatic adjustment of tuning mirror 10 by adjusting a drive arm of drive motor 20 to pivot the mirror. In this prior art laser system a change in the angle of illumination on the grating of 1.0 milliradian will result in a change in the selected wavelength of about 39 pm. A change in the direction of the beam exiting the chamber will also change the selected wavelength but because of the 26X prism beam expander the effect is a factor of 26 less. Therefore, a 1.0 milliradian change in the direction of the beam exiting the chamber will cause only a 1.5 pm change in the selected wavelength.

As is evident from FIG. 2, the laser gas in the beam path within the chamber has the shape of a trapezoid which like a prism causes a very slight bending of the laser beam. For an ArF exciter laser with trapezoidal 45° mirrors with a three atmosphere mixture of 96.5% neon, 3.4% argon and 0.1% fluorine, the bending angle is 366 microradian as compared to a complete vacuum in the chamber. For the ArF laser shown in FIG. 2, a bending of the laser beam of 366 microradians corresponds to a change in the selected wavelength of 0.54 pm. This change is very small compared to the tuning range of tuning mirror 10, so that the bending of the beam caused by the gas "prism" is automatically compensated for by the wavelength feedback control. Also, a small quickly occurring change in the gas pressure during operation produces a very slight change in the wavelength which might be too fast for correction by normal feedback control. For example, a 2% change in the pressure at the same gas temperature would produce a wavelength change of about 0.011 pm.

In the past, operational variations in wavelength for these types of lasers have typically been in the range of about ∀ 0.3 pm, and laser specifications on wavelength stability have been about ∀ 0.5 pm. Therefore, in the past wavelength fluctuations (in the range of about 0.011 pm) caused by small laser gas pressure changes in the trapezoidal shaped contained laser gas has not been recognized as a problem. Furthermore, as indicated above, if the pressure change is long compared to the wavelength feedback control cycle (which typically has been less than about seven milliseconds) any wavelength deviation from a target wavelength would be quickly and automatically corrected.

A known technique for measuring changes in light direction is to focus the beam on a spot partially blocked by a knife edge and to monitor the intensity of light not blocked. Changes in the intensity is a measure of the beam fluctuation.

Efforts have been made recently by Applicants and others to reduce wavelength variations and specifications on wavelength stability have become tighter.

What is needed in laser equipment and techniques to improve wavelength stability.

SUMMARY OF THE INVENTION

The present invention provides an electric discharge, narrow band gas laser with improvements in wavelength stability. Improvements result from reduced laser beam directional fluctuations or fast correction of those fluctuations. Applicant has discovered, using an extremely sensitive knife edge optical technique, that gas discharge laser windows in a trapezoidal configuration were causing slight wavelength perturbations when laser gas density varied during laser operation. The optical technique involves using test laser beam directed through the discharge region of the gas discharge laser, blocking a portion of the beam with a knife edge and measuring the non-blocked portion of the beam to monitor beam deflection. With this technique, Applicant can measure beams deflection with an accuracy of about 0.3 microradians and with a time response of about 1 microsecond. An improvement in wavelength stability is achieved by orienting the laser chamber windows parallel to each other at a selected angle between 40° and 70° with the laser beam direction. The change eliminates wavelength fluctuations caused by laser beam direction fluctuation caused pressure fluctuations and the prism effect resulting from windows mounted in a prior art trapezoidal configuration. Beam directional fluctuations can also be measured during laser operation using the knife edge technique or similar fast response techniques such as a quadrant detector and the measured values can be used in a feedback arrangement along with fast wavelength control unit to compensate for changes in beam direction. In addition techniques for reducing the causes of beam direction fluctuations are disclosed. These include techniques for minimizing the effects of laser discharge caused pressure waves.

BRIEF DESCRIPTION OF THE DRAWINGS

FIGS. 11A through 11D2 show laser features used to reduce adverse effects of discharge caused pressure waves.

DETAILED DESCRIPTION OF PREFERRED EMBODIMENTS

Knife Edge Experiments

Figure 2:
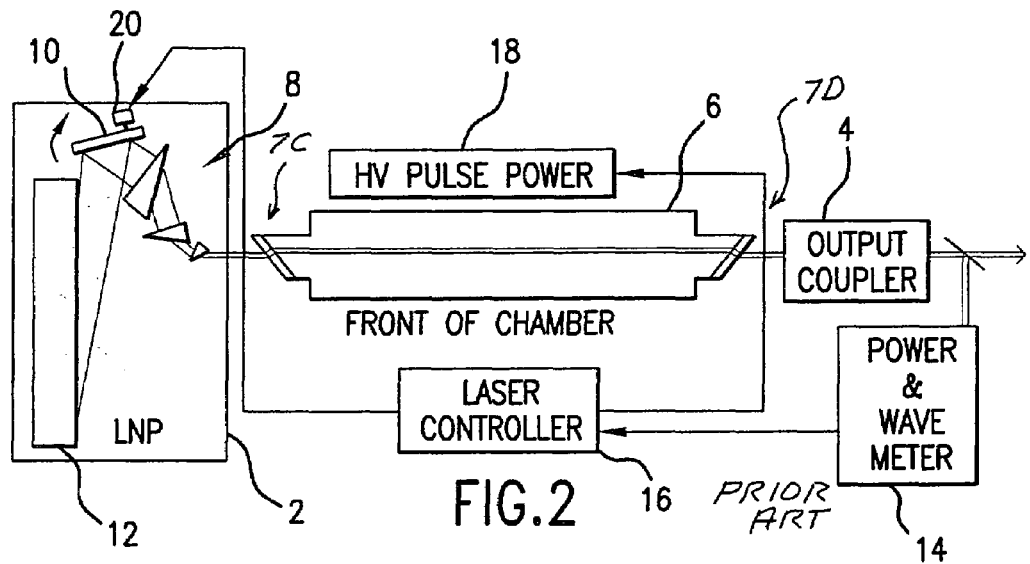
FIG. 2 shows important features of a prior art high repetition rate, narrow-band gas discharge laser used for integrated circuit lithography.
Figure 3:
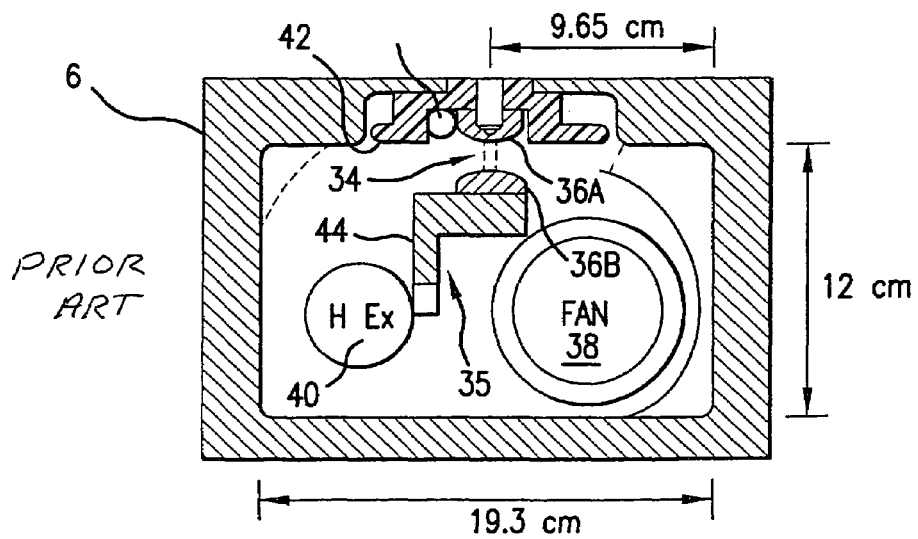
FIG. 3 shows a cross section of the laser chamber depicted in FIG. 2.
Figure 4:
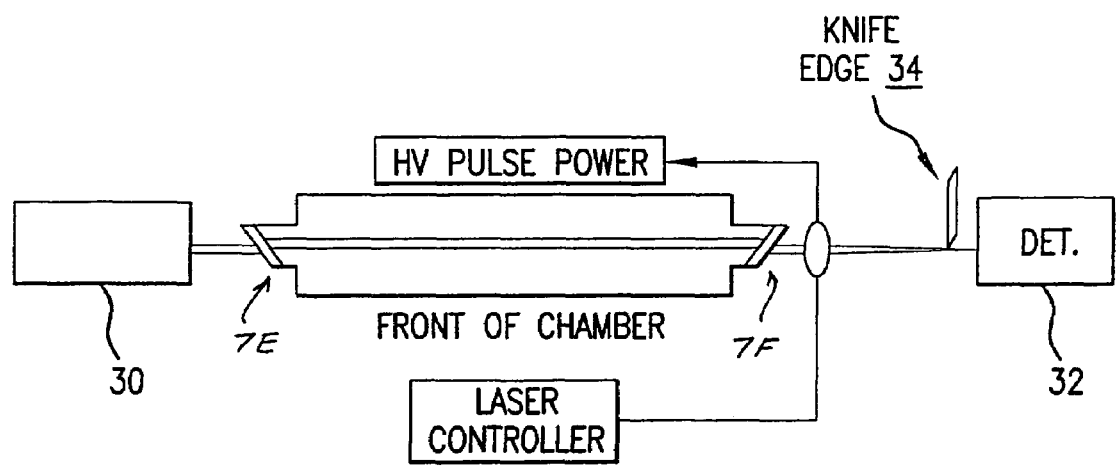
FIG. 4 shows a test arrangement utilized by Applicant.

Applicant has conducted extensive experiments to determine the causes and effects of beam bending within the laser gas of the type of electric discharge lasers described in FIG. 2. A slightly simplified version of his basic experimental set up is shown in FIG. 4. The output coupler and the LNP were removed and replaced with a transilluminating diode laser (Model No. 31-0334 by Coherent, Inc. with offices in Santa Clara, Calif.) 30, lens 31, a diode detector (Model No. DET 200 by ThorLabs, Inc. with offices in Newton, N.J.) 32 and a knife edge 34 which cut about 50 percent off from one side of the laser beam all as shown in FIG. 3. Diode laser 30 is a small inexpensive laser producing a continuous visible light, red beam at a wavelength of 635 nm. Any bending of the beam shows up as a change in the intensity of the light from laser 30 measured by detector 32. During a set of tests, the laser was discharged and the fan was operated at a normal speed of about 3800 rpm which would be sufficient for 2000 Hz repetition rate. There was no lasing generated in the laser gas because the laser optics were not in place. (The simplified drawing does not show a pyrex plate which Applicant placed just upstream of lens 31 or a turning mirror just downstream of lens 31. The pyrex plate blocked discharge generated light and the turning mirror merely made placement of the optics more convenient.)

Figure 6:
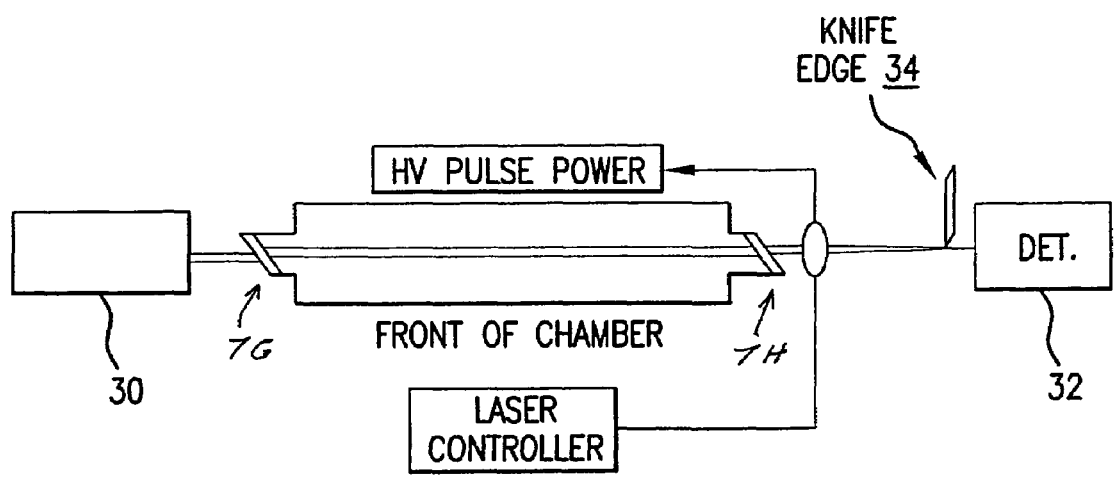
FIG. 6 shows a modified test arrangement to prove the benefits of the present invention.
Figure 5:
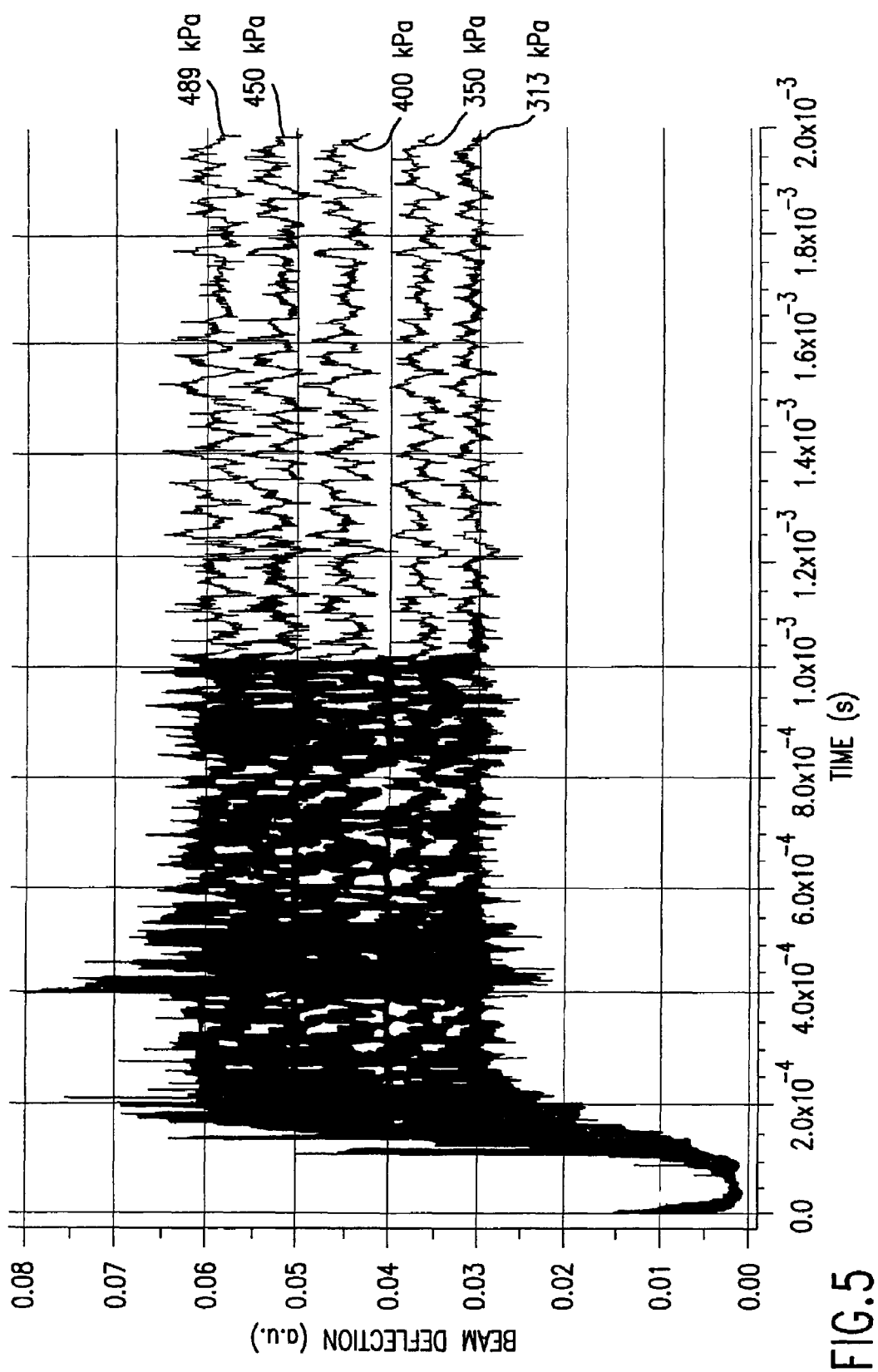
FIG. 5 shows some of Applicant's test data.

Some of Applicant's results are shown in FIG. 5. This figure presents five sets of beam deflection data taken at different times (but plotted together in FIG. 5) as a function of time just prior to and for a period of 2 milliseconds after an electrode discharge. The laser repetition rate was low (less than 100 Hz) so that only one pulse is represented in each two-millisecond plot. The laser gas was held at nominal pressures of 489 kPa, 450 kPa, 400 kPa, 350 kPa and 313 kPa, respectively, for the five sets of data. The data for each of the five sets were plotted on the same chart with the discharge synchronized at time zero in each case. The data clearly shows a linear variation of beam deflection with nominal laser gas pressure. This relationship is about 1.25 :rad/kPa for this chamber with 45° windows mounted trapezoidally. Applicant's experimental beam deflection as a function of laser gas pressure agrees almost perfectly with the corresponding value of prism beam deflection calculated using published index of refraction data for the laser gas mixture. Applicant then modified the laser configuration shown in FIG. 4 at 7E and 7F by orienting the windows into a parallel arrangement as shown in FIG. 6 at 7G an 7H. He then repeated the test as described above at various nominal pressures and the result was no variation in beam direction with nominal pressure.

Figure 1:
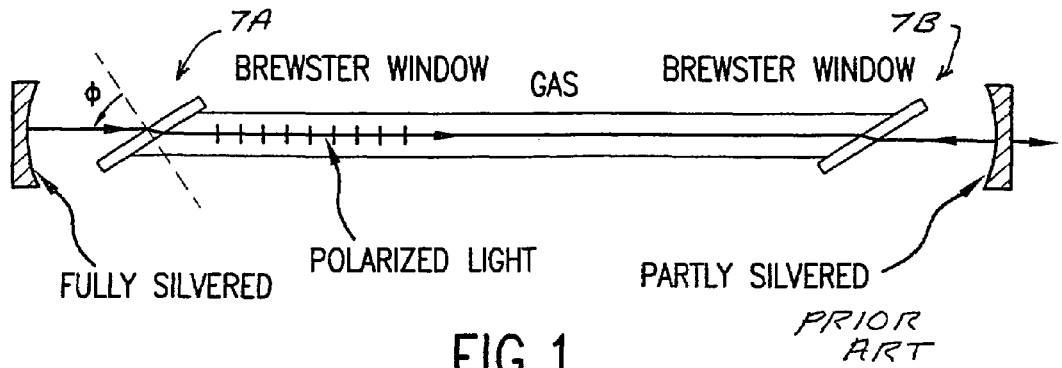
FIG. 1 shows a prior art Brewster's window arrangement for a simple gas laser design.
Figure 11A:
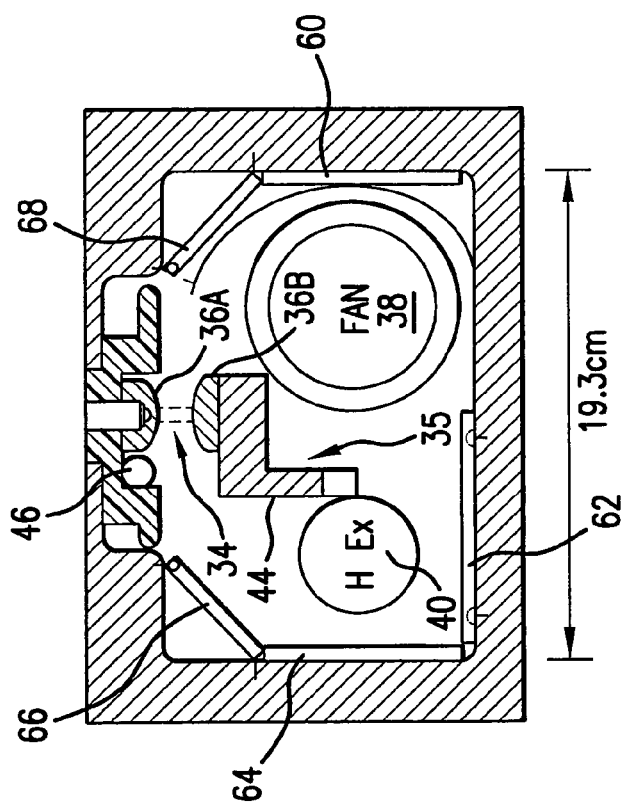
Figure 11B:
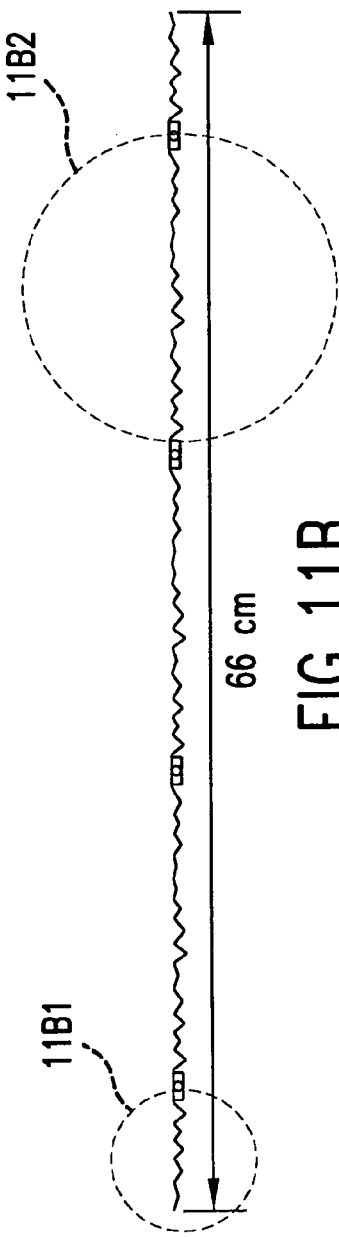

Applicant's data plotted in FIG. 5 also shows enormous deflections of the beam during an approximately 0.25 millisecond period following each burst. This perturbation is due primarily to very large density gradients across the beam path which result from the discharge. With the fan speed used in this experiment, it takes about 0.25 ms for the flowing gas in this case to push the discharge disturbed laser gas out of the beam path. The increase in deflection seen at about 0.45 ms after the discharge (zero time) is due to reflection of the acoustic waves from the chamber walls which as shown in FIG. 3 is about 9 cm from location of the discharge. The shock wave travels in the laser gas about 21 cm in 0.45 ms and produces density gradients in the beam path when it returns to the discharge region which in turn bend the beam. Perturbations of the type shown at about 0.45 ms in FIG. 5 can be minimized using the technique discussed in U.S. patent application Ser. No. 09/490,835 filed on Jan. 25, 2000 by Applicant and some of his fellow workers. (Techniques for minimizing the effects of wall reflections are shown in FIGS. 11A through 11D2 which are copied from that application. FIG. 11A shows a cross-section of a laser chamber with baffles attached by screws to the chamber walls at positions 60, 62, 64 and in the upper corners as shown at 66 and 68. The baffles have a cross section which is saw-tooth shaped with varying shaped teeth as shown in FIGS. 11B1 and 2 which are end views of baffle 60 and a portion of baffle 60. As indicated in detail views of portions of baffle 60 (FIG. 11B1 and FIG. 11B2), the pitch of the teeth vary from 0.390 inch to 0.590 inch and the height of the teeth vary from 0.120 inch to 0.280 inch. The teeth are aligned generally in the direction of gas flow and perpendicular to the laser beam direction and the long dimension of the discharge region. In this preferred embodiment the baffled material is 20 gage nickel plated aluminum sheet. This baffle design is very effective in dispersing the discharge produced pressure waves. This design reflects the waves in a great number of directions with minimum reflection in directions perpendicular to the long direction of the discharge region. The result is that if and when acoustic energy from any particular pulse returns to the discharge region, the energy (or pressure perturbation) of the wave is fractionalized into a very large number of pieces, and thus the net index of refraction gradients produced in the beam path are reduced.

Beam Deflections Due to Fan Caused Short Term Density Fluctuations and Prism Effect As indicated above, the beam direction changes at the rate of 1.25 :rad/kPa with pressure fluctuations in the laser gas (causing density fluctuations) due to the prism effect caused by the trapezoidal shaped laser gas profile. Since the nominal laser gas pressure is about 400 kPa for an ArF laser a 2% fluctuation in the gas density (corresponding to 8 kPa) would result in a beam deflection of 10 :rad. Deflection of this magnitude would change the selected wavelength by about 0.015 pm.

Figure 7:
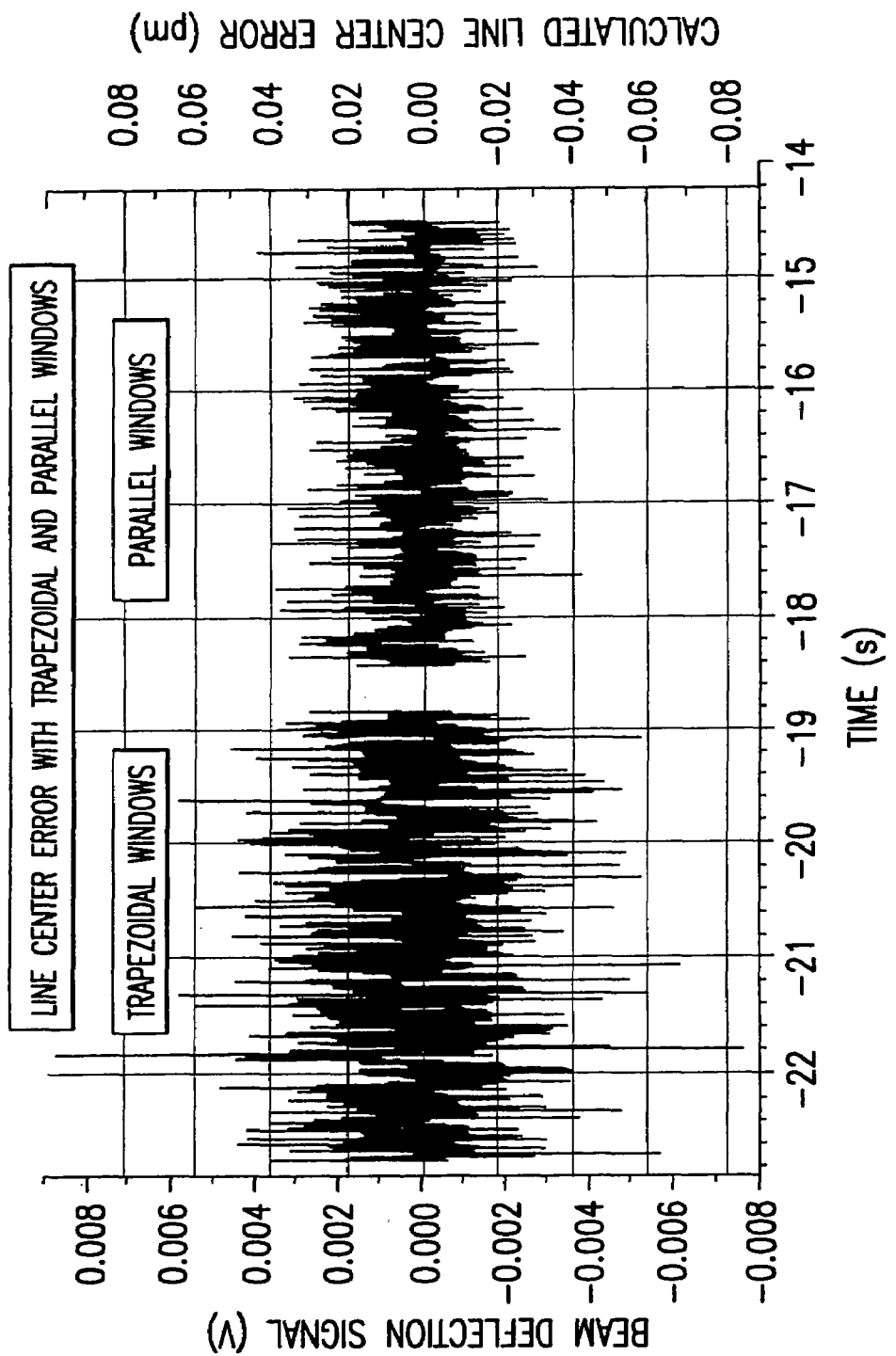
FIG. 7 shows a "before" and "after" comparison demonstrating the benefits of the present invention.

Applicant suspected that the trapezoidal shaped laser gas combined with fan caused short term pressure fluctuations (in the range of about 2%) were causing fluctuations in laser beam direction which were in turn causing some of the wavelength fluctuations shown in FIG. 5. In order to test this theory, Applicant operated the laser with the fan running at normal speed but with no discharge and measured the test beam fluctuations with the set up shown in FIG. 4. He then reversed the tilt direction of one of the chamber windows so that the windows were aligned parallel to each other as shown in FIG. 6 and he compared beam deflection data from the FIG. 6 configuration to similar data from the FIG. 4 configuration. The results are shown in FIG. 7. The left side of the graph is a plot of data taken with trapezoidal arranged windows and the right side of the graph is a plot of data taken with parallel arranged windows. This comparison in FIG. 7 clearly confirms Applicant's suspicions. Although not shown, in both cases, fluctuations in beam direction virtually disappeared when the fan was shutdown.

Figure 8:
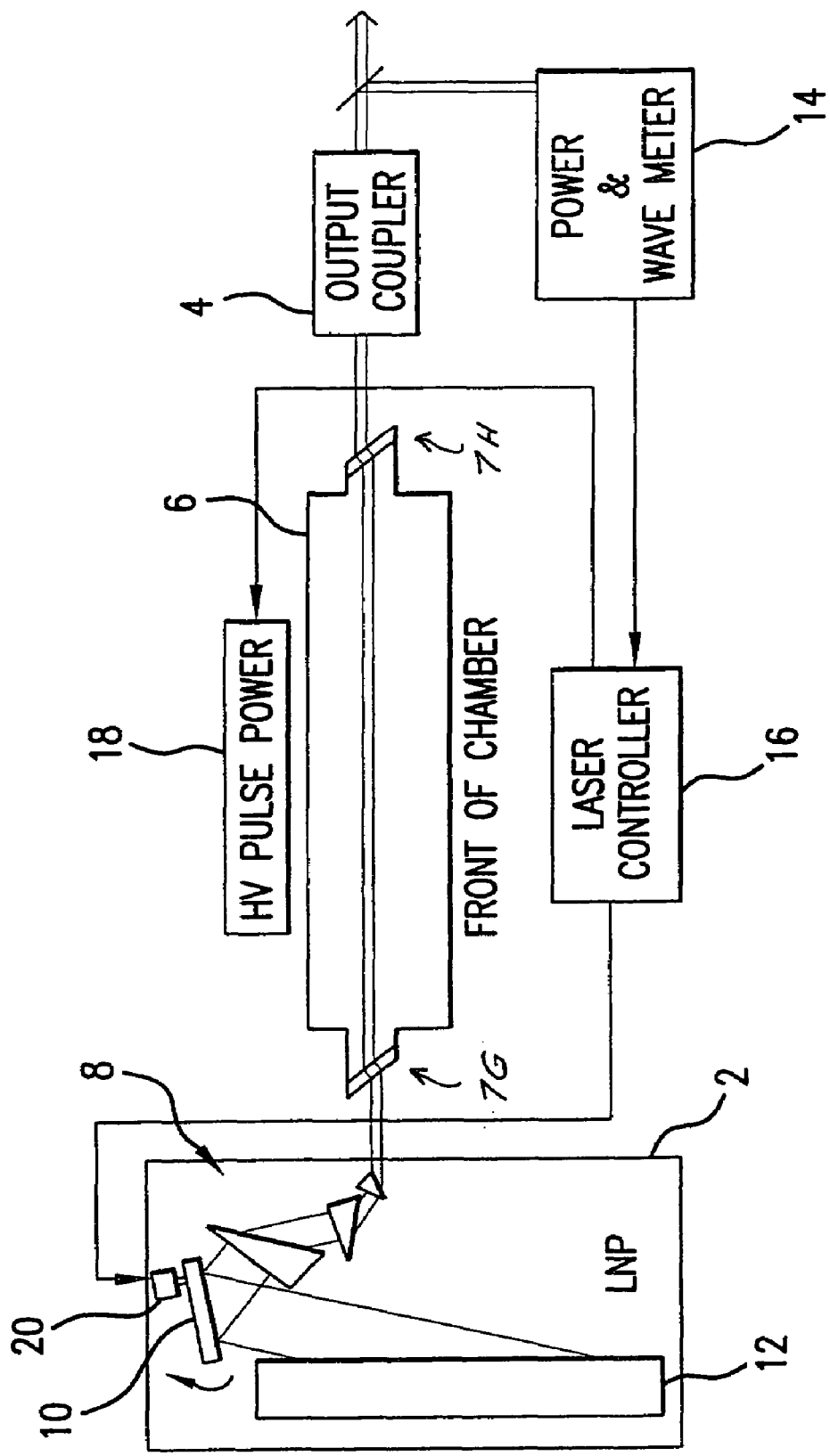
FIG. 8 shows revisions to the high repetition rate narrow band gas discharge laser to incorporate an embodiment of the present invention.

From the FIG. 7 comparison, Applicant has determined that the trapezoidal shape of the contained laser gas (under the influence of fan caused density changes) is responsible for wavelength instabilities of about 0.012 pm. Based on these tests, Applicant has redesigned the laser system shown in FIG. 2 as shown in FIG. 8 at 7G and 7H to incorporate parallel chamber windows both tilted at an angle of about 45° with the beam direction. The resulting improvement in laser line center stability of about ∀ 0.012 pm represents a reduction from the typical present day stability of about ∀ 0.3 pm to about 0.29 pm. While improvements may seem small, it is nevertheless significant, and as other causes of wavelength fluctuations are eliminated or minimized, this 0.012 pm becomes relatively more important. Also, the advantage and positive effect of the parallel windows becomes more important as fan speed and gas velocity increase. Such increases are expected in the near future for these types of lasers to satisfy a need in the integrated circuit fabrication business for greater productivity.

OTHER IMPROVEMENTS

As indicated in FIG. 7, although Applicant, by changing the window design has made a significant improvement in these narrow band gas discharge lasers, a lot is left to be done in terms of minimizing laser gas related beam deflections. Applicant believes that most of the beam deflection (shown at the right side of FIG. 7) left after correcting the window design is due to turbulent pressure cells created in the fast flowing laser gas. Beam deflections can be further reduced by making changes within the chamber to make these turbulent cells smaller. Applicant suspects that substantial improvements can be made by applying known techniques utilized in fan designs in other industries which have over the years been implemented mainly to reduce fan noise.

Figure 12:
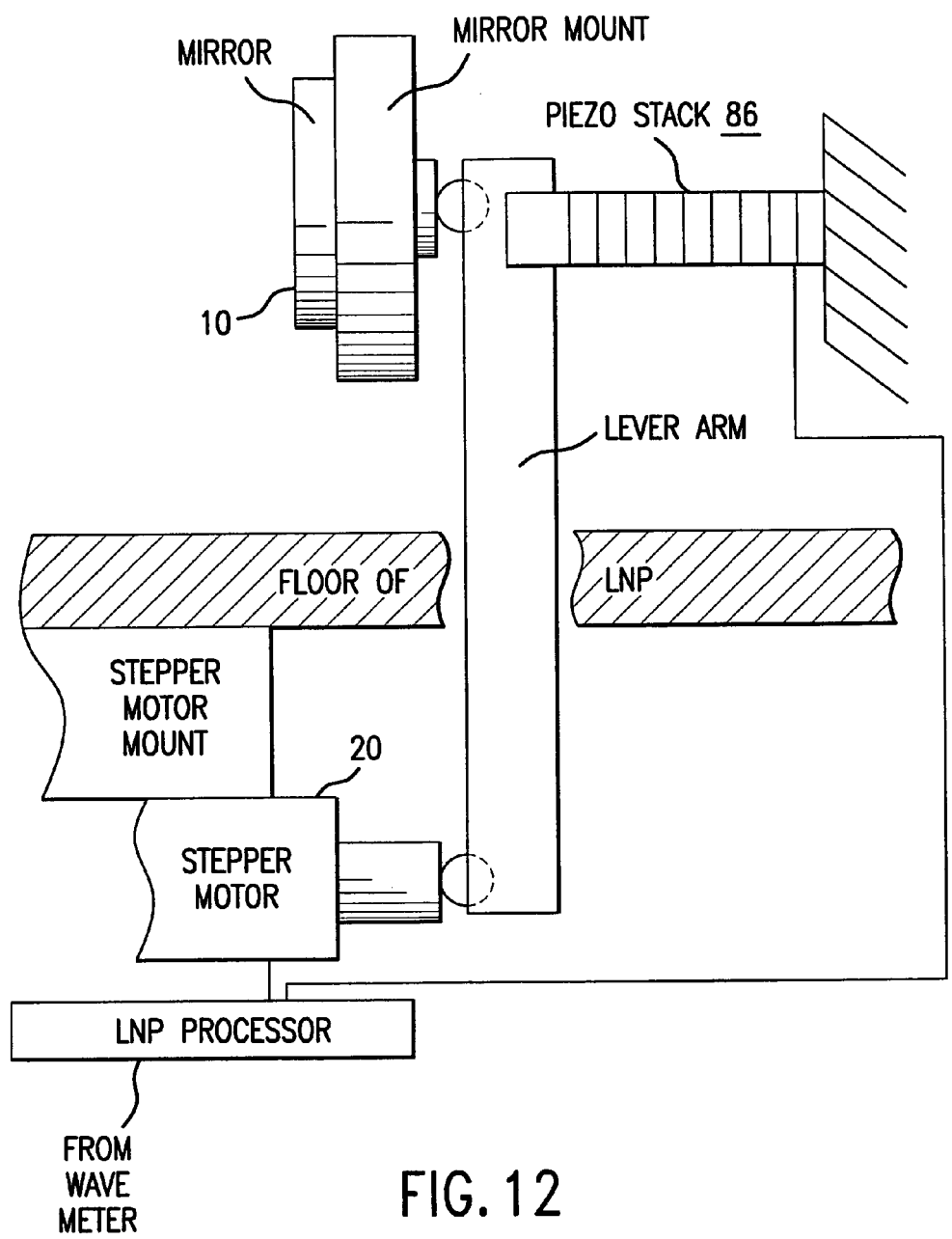
FIG. 12 is a drawing of an LNP with a fast response piezoelectric driver used to turn the tuning mirror.

Also it is possible to speed up the feedback wavelength control discussed above by utilizing faster components such as piezoelectric drivers and faster computer systems and techniques for control. FIG. 12 shows an improved LNP which incorporates a piezoelectric driver 86 to provide very fast adjustment of turning mirror 10 to permit pulse to pulse feedback control of the wavelength. Large movements of the mirror are accomplished with slower response stepper motor 20.

Knife Edge Test Equipment

Applicant's test setup shown in FIGS. 4 and 6 is an extremely valuable technique for measuring beam deflections in gas discharge lasers and for permitting scientists to identify causes of rapid beam fluctuations. Applicant has used this technique to identify the extent to which temperature gradients in the gain region cause a bending of the laser beam and a corresponding change in wavelength. This temperature gradient occurs during burst mode operation such as an operating cycle where the laser is operated in bursts of pulses of for example 300 pulses at 1000 Hz each burst followed by a down time of 0.3 seconds as described in U.S. Pat. No. 6,034,978. It takes about 45 milliseconds for gas to circulate in a laser chamber such as the one shown in FIG. 3. Therefore, about 45 milliseconds after the start of a burst of pulses, hot gas produced by the first pulse of the burst returns to the discharge region producing a shift temperature (and density) gradient across the gain region. This density gradient across the beam path causes a bending of the laser beam in the gain region and causes slight changes in the wavelength. This returning (first pulse disturbed) gas also contains atomic and molecular structures which vary from equilibrium and thus have an effect on the index of refraction in the beam path causing some perturbations in the beam direction. Applicant has used his knife edge technique to investigate these effects.

Figure 9:
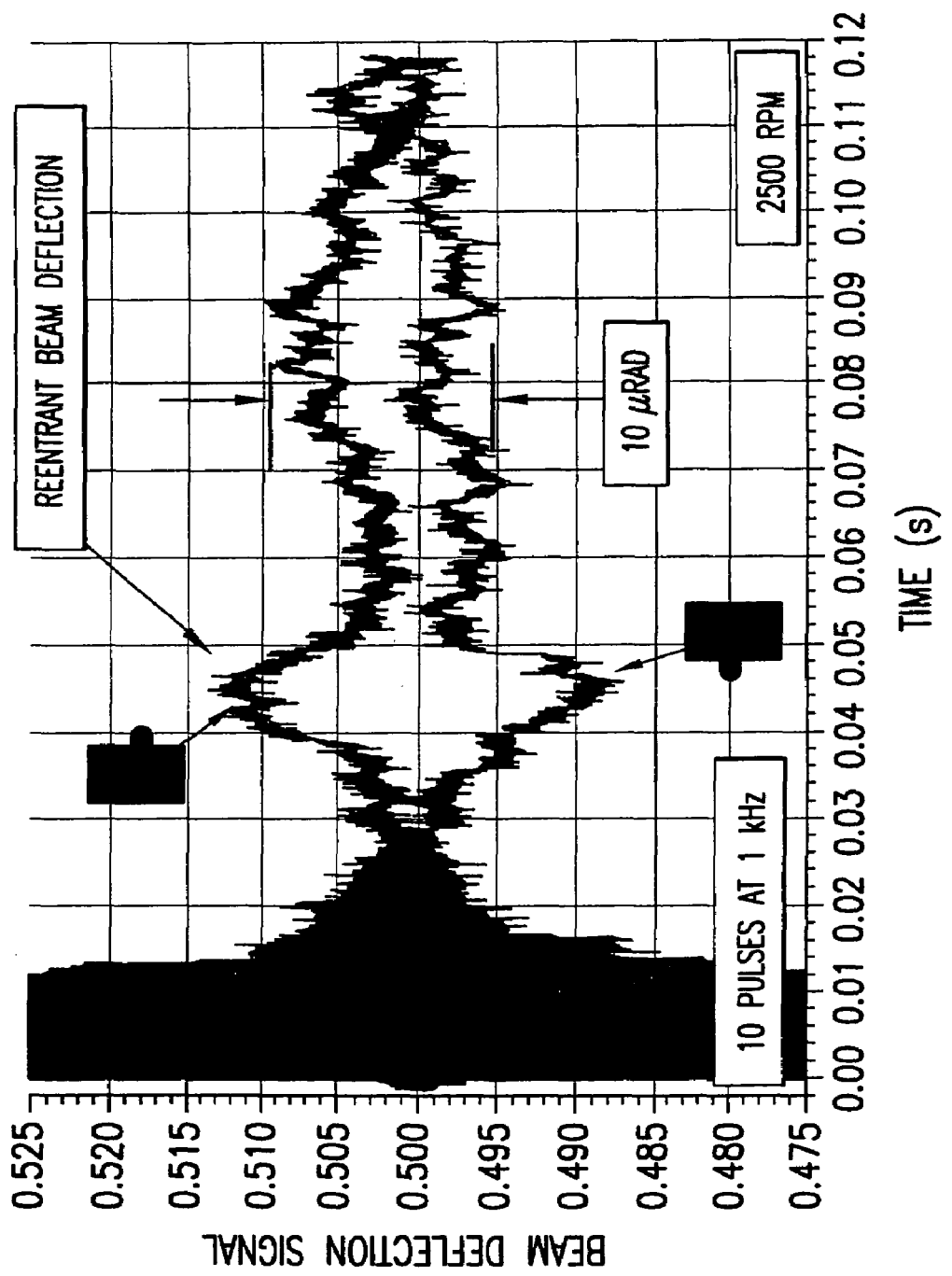
FIGS. 9, 10A and 10B are graphs showing beam deflections monitored using a special knife edge optical technique.

FIG. 9 shows some of the results of one of these experiments. In this case, a laser was operated with a setup as shown in FIG. 4 at 1000 Hz for a period of 0.01 second (10 pulses) and data was recorded first with the knife edge at the left of the beam then with the knife edge at the right of the beam and the recorded data was plotted superimposed as shown in FIG. 9. These plots clearly show the bending of the beam by about 7 microradians. As indicated above this 7 microradian disturbances in the beam direction unless corrected or compensated for would result in a wavelength shift of about 0.0105 pm.

Figure 10A:
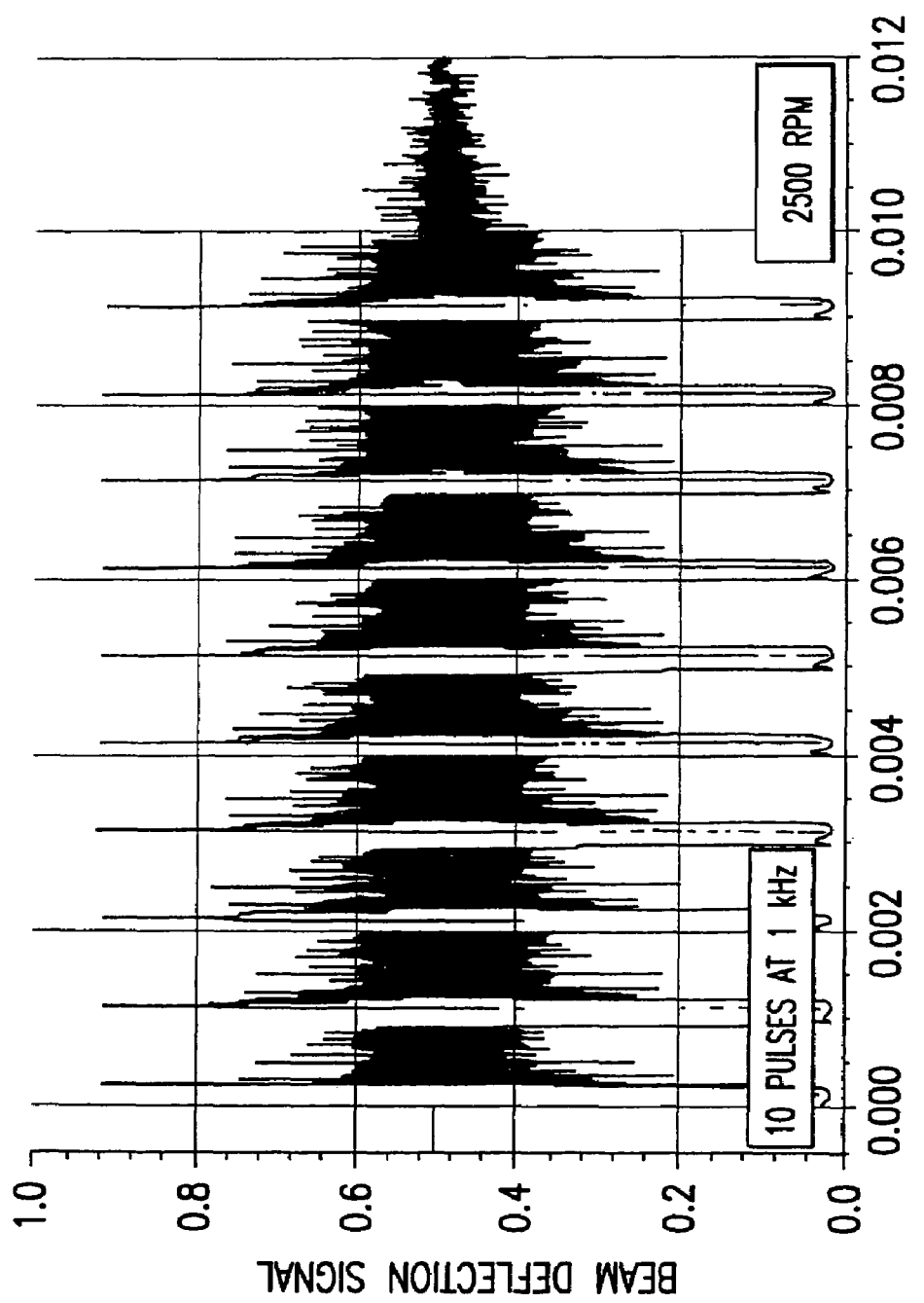
Figure 10B:
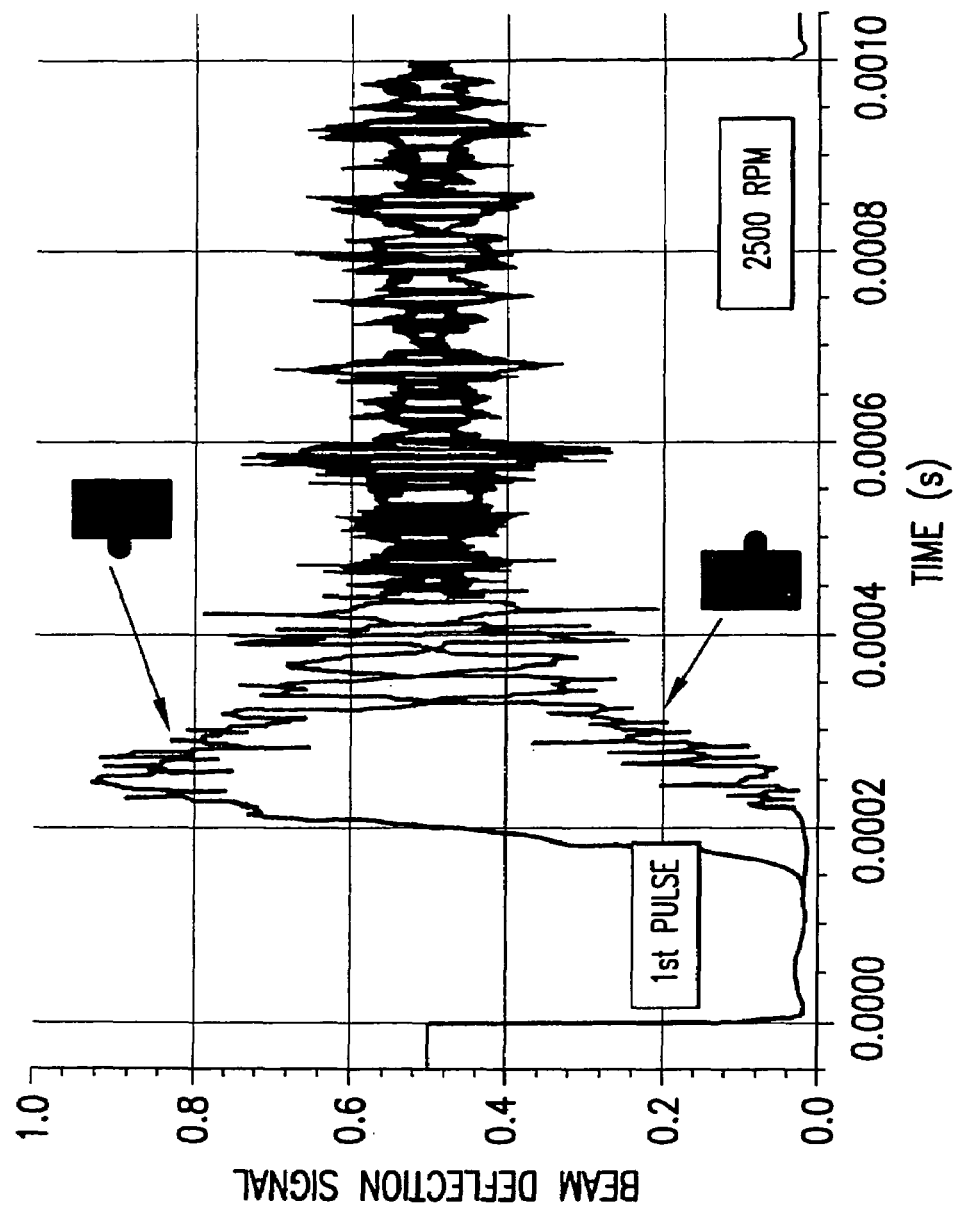

FIG. 10A is an expanded graph showing the first 12 milliseconds of the FIG. 9 graph and FIG. 10B is a further expanded graph showing only the first 1.0 millisecond of the FI. 9 graph. These graphs show the almost unbelievable sensitivity of this technique for measuring beam deflections in gas discharge lasers. Applicant estimates that the angular resolution of this technique is in the range of 0.3 microradians. The reader will note by comparing FIGS. 10B and 9 that the laser beam at about 0.00025 seconds after the pulse is bent in a direction opposite the bending direction at 0.045 seconds after the pulse indicating that the pulse disturbed gas leaving the discharge affects the index of refraction in a manner opposite to its effect on reentering the discharge region.

Active Feedback Control of Beam Directional Fluctuations

Figure 13:
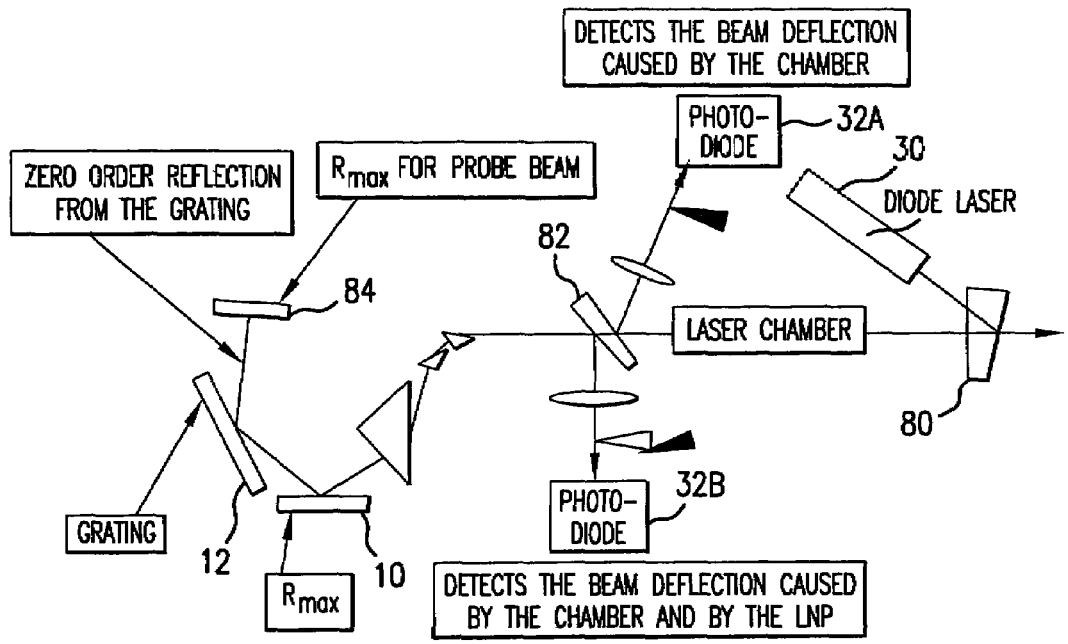
FIGS. 13 and 14 show techniques for measuring beam deflections during laser operation.
Figure 14:
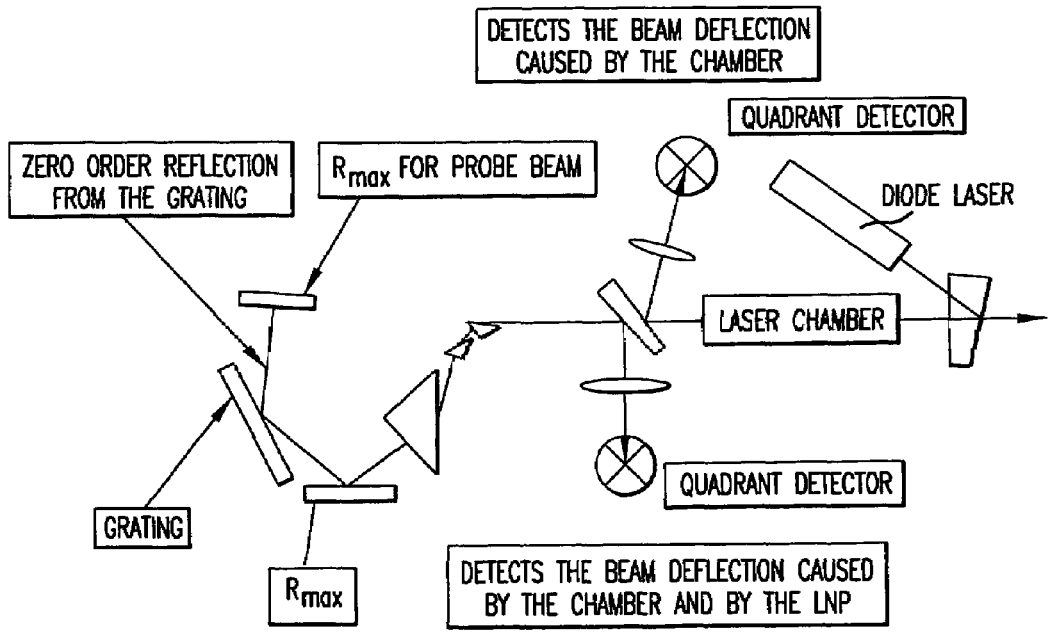

FIG. 13 shows a technique of measuring beam deflections during laser operation of a line narrowed gas discharge laser. A diode laser 30 produces a CW beam which is reflected of the back surface of the laser output coupler 80. (The back surface is coated with an anti-reflective coating for UV light but it nevertheless reflects about 4 percent of the diode laser beam which is in the visible range at 635 nm. The reflected portion of the diode laser beam transverses the laser chamber and a portion of the beam reflects off the rear chamber window 82 to photodiode detector 32A which measures the beam deflection within the laser chamber. Most of the diode laser light will pass through rear window 82 substantially aligned with the gas discharge laser beam which is a short pulse UV laser beam. This portion will be expanded in the three prism beam expander, reflect off the tuning mirror 10 and the zero order reflection off grating 12 will be retroreflected off mirror 84 and returned to window 82 where a portion will be reflected to photodiode 32B which will detect the net beam deflections in both the chamber and the LNP. This arrangement measures deflections in only the horizontal direction. By using a quadrant detector as shown in FIG. 14, deflections in both horizontal and vertical directions can be monitored. As described above, the knife edge detector can monitor beam direction with a time sensitivity of 1 microsecond. The most important time segment will be a few microseconds just prior to the discharge. Therefore, monitoring hardware and software should be provided which will permit the monitoring of the knife edge data during a few microsecond period, just prior to the discharge. This data will be representative of the UV beam direction for the immediately following pulse.

Figure 15:
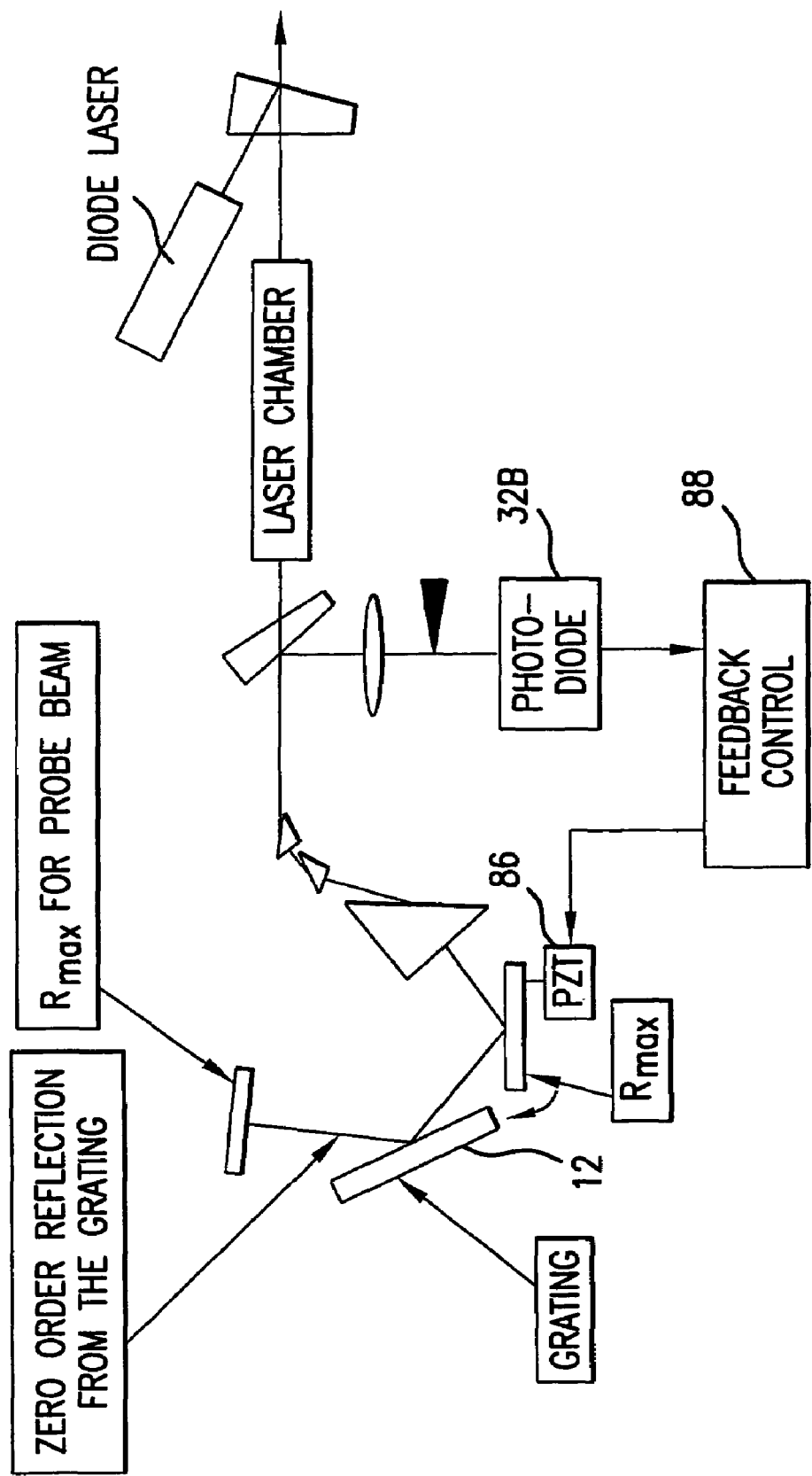
FIG. 15 shows a technique for active control of wavelength fluctuations due to beam direction fluctuations.

FIG. 15 shows a technique for feedback control of beam direction to substantially eliminate fluctuations in wavelength due to fluctuations in beam direction. In this case, the signal from photodiode 32B is used by feedback control unit 88 to drive very fast response PZT driver 86 to control the position of tuning mirror 10. Control unit 88 controls driver 86 to maintain the signal from photodiode detector 32B at a substantially constant value. The result is that light reflected off grating 12 is reflected at a substantially constant angle. Since the beams from both the diode laser and the gas discharge laser follow substantially the same path through the LNP, the gas discharge laser beam must reflect off the grating at a substantially constant angle. This means that the selected wavelength will be substantially constant. This arrangement permits adjustment of tuning mirror 10 during periods when the gas discharge laser is idle. This permits the system to correct for wavelength drift during idle periods when the prior art wavelength feedback mechanisms are not available. This arrangement also permits pre-tuning of wavelength prior to the start of discharge operation.

The reader should note that additional control could be achieved by using the quadrant detector shown in FIG. 14 and replacing mirror 10 with a mirror which can be controlled in two directions of rotation so that both horizontal and vertical beam direction fluctuations could be corrected. Correcting for vertical beam fluctuations is not necessary for wavelength control but could be useful for control of pulse energy fluctuation due to beam deflections in the vertical direction. Applicant estimates based on knife edge experiments to test for vertical beam fluctuations that vertical beam fluctuations can be the cause of pulse energy variations in the range of about 2 to 5 percent. These fluctuations could be substantially eliminated by a feedback control similar to the one described in detail above for compensating for horizontal fluctuations. An alternate to the use of the quadrant detector would be to use a second knife edge detector system but positioned to measure only vertical beam fluctuations. This could be used to control the rotation of mirror 10 about a horizontal pivot axis or an additional tuning mirror could be placed in the beam path for vertical beam deflection compensation.

Various modifications may be made to the present invention without altering its scope. For example, the windows could be oriented at angles other than about 45° and the Brewster's angle. Applicant recommends a general range between about 40° and 70°. Those skilled in the art will recognize many other possible variations. Accordingly, the above disclosure is not intended to be limiting and the scope of the invention should be determined by the appended claims and their legal equivalents.

I claim:

1. An electric discharge narrow band gas laser with minimized wavelength variations caused by fluctuations in laser gas density resulting in laser beam directional changes comprising: A) a laser chamber, B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan for circulating said laser gas within said chamber and through said discharge region, E) an output coupler and a line narrowing module defining a resonant cavity and laser beam direction, F) two chamber windows having surfaces oriented substantially parallel to the surface of each other and at an angle between 40° and 70° with said beam direction, and, G) a fast beam deflection monitoring means to monitor deflection of said laser beam.

2. A laser as in claim 1 wherein said angle is approximately equal to Brewster's angle for the laser gas and window materials.

3. A laser as in claim 1 wherein said angle is about 45°.

4. A narrow band electric discharge gas laser with minimized wavelength variations caused by fluctuations in laser gas density resulting in laser beam directional changes comprising: A) a laser chamber, B) an elongated electrode structure enclosed within said chamber comprising an elongated anode and an elongated cathode separated by a distance defining a discharge region in which a discharge laser beam is amplified, said discharge region defining a long dimension in a beam direction, C) a laser gas contained in said chamber, D) a fan for circulating said laser gas within said chamber and through said discharge region, E) an output coupler, F) a grating based line narrowing module comprising a grating and a tuning means to control direction of illumination of light from said chamber on said grating, said direction of illumination defining an illumination direction, G) a fast beam deflection monitoring means to monitor deflection of said laser beam; and H) a feedback control means for controlling said tuning means based on signals from said beam deflection monitoring means.

5. A laser as in claim 1 and further comprising a pulse energy control means for minimizing pulse energy fluctuations caused by discharge laser beam fluctuations in a vertical direction.

6. A laser as in claim 4 wherein said feedback control means includes means for pretuning said discharge laser prior to beginning of lasing operation.

7. A laser as in claim 4 wherein said feedback control means includes means for correcting for wavelength drift during idle periods of said discharge laser.

8. A laser as in claim 4 wherein:
said tuning means is a pivoting mirror.

9. A laser as in claim 8 wherein said pivoting mirror includes means for pivoting about each of two axis and said feedback control means includes means for controlling degrees of pivot about two axes based on signals from said beam deflection monitoring means.

10. A laser as in claim 8 and further comprising a pulse energy control means for minimizing pulse energy fluctuations caused by discharge laser beam fluctuations in a vertical direction.

11. A laser as in claim 10 wherein said pivoting mirror includes means for pivoting about each of two axis and said feedback control means includes means for controlling degrees of pivot about two axes based on signals from said beam deflection monitoring means.

12. A laser as in claim 8 wherein said feedback control means includes means for pretuning said discharge laser prior to beginning of lasing operation.

13. A laser as in claim 8 wherein said feedback control means includes means for correcting for wavelength drift during idle periods of said discharge laser.

14. An electric discharge gas laser comprising: A) a laser chamber, B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan circulating said laser gas within said chamber and through said discharge region, E) an output coupler and a line narrowing module defining a resonant cavity and laser beam direction, F) two chamber windows having surfaces oriented substantially parallel to the surfaces of each other and at an angle between 40° and 70° with said beam direction, and G) means or reducing the impact of discharge produced pressure waves reflected within the chamber upon returning to the discharge region having means for reducing the net index of refraction gradients produced in the beam when the reflected pressure wave returns to the discharge region.

15. An electric discharge gas laser comprising: A) a laser chamber, B) an elongated electrode structure enclosed within said chamber comprising an elongated anode and an elongated cathode separated by a distance defining a discharge region in which a discharge laser beam is amplified, said discharge region defining a long dimension in a beam direction, C) a laser gas contained in said chamber, D) a fan circulating said laser gas within said chamber and through said discharge region, E) an output coupler, F) a grating based line narrowing module comprising a grating and a tuning means for controlling the direction of illumination of light from said chamber on said grating, said direction of illumination defining an illumination direction, G) a fast beam deflection monitoring means for monitoring deflection of said discharge laser beam; H) a feedback control means for controlling said tuning means based on signals from said beam deflection monitoring means; I) said tuning means comprising a pivoting mirror; and J) means for reducing the impact of discharge produced pressure waves reflected within the chamber upon returning to the discharge region.

16. An electric discharge gas laser comprising: A) a laser chamber, B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan circulating said laser gas within said chamber and through said discharge region, E) an output coupler and a line narrowing module defining a resonant cavity and laser beam direction, and, F) means For reducing the impact of discharge produced pressure waves reflected within the chamber upon returning to the discharge region having means for reducing the net index of refraction gradients produced in the beam when the reflected pressure wave returns to the discharge region.

17. The apparatus of claim 15 further comprising:
the means for reducing the impact of discharge produced pressure waves further comprises means for reducing the net index at refraction gradients produced in the beam when the reflected pressure wave returns to the discharge region.

18. The apparatus of claim 14 further comprising:
the means for reducing the impact of discharge produced pressure waves further comprises means for reducing the impact to the discharge region of the reflection of the pressure waves from the chamber walls.

19. The apparatus of claim 15 further comprising:
the means for reducing the impact of discharge produced pressure waves further comprises means for reducing the impact to the discharge region of the reflection of the pressure waves from the chamber walls.

20. The apparatus of claim 16 further comprising:
the means for reducing the impact of discharge produced pressure waves further comprises means for reducing the impact to the discharge region of the reflection of the pressure waves from the chamber walls.

21. An electric discharge gas laser comprising: A) a laser chamber, B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan circulating said laser gas within said chamber and through said discharge region, E) an output coupler and a line narrowing module defining a resonant cavity and laser beam direction, F) two chamber windows having surfaces oriented substantially parallel to the surfaces of each other and at an angle between 40° and 70° with said beam direction, G) a fast beam deflection monitor monitoring deflection of said beam, and H) a bandwidth stabilizer reducing the impact upon returning to the discharge region of discharge produced pressure waves reflected within the chamber.

22. A narrow band electric discharge gas laser with minimized wavelength variations caused by fluctuations in laser gas density resulting in laser beam directional changes comprising: A) a laser chamber, B) an elongated electrode structure enclosed within said chamber comprising an elongated anode and an elongated cathode separated by a distance defining a discharge region in which a discharge laser beam is amplified, said discharge region defining a long dimension in a beam direction, C) a laser gas contained in said chamber, D) a fan circulating said laser gas within said chamber and through said discharge region, E) an output coupler, F) a grating based line narrowing module comprising a grating and a tuning mechanism controlling the direction of illumination of light from said chamber on said grating, said direction of illumination defining an illumination direction, G) a fast beam deflection monitor monitoring deflection of said laser beam; H) a feedback controller controlling said tuning mechanism based on signals from said beam deflection monitor; I) said tuning mechanism comprising a pivoting mirror; and J) a bandwidth stabilizer reducing the impact upon returning to the discharge region of discharge produced pressure waves reflected within the chamber.

23. An electric discharge narrow band gas laser comprising: A) a laser chamber, B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan circulating said laser gas within said chamber and through said discharge region, E) an output coupler and a line narrowing module defining a resonant cavity and laser beam direction, and, F) a bandwidth stabilizer reducing the impact upon returning to the discharge region of discharge produced pressure waves reflected within the chamber having a refraction gradient reduction mechanism reducing the net index of refraction gradients produced in the beam when the reflected pressure wave returns to the discharge region.

24. The apparatus of claim 21 further comprising:
the bandwidth stabilizer further comprises a refraction gradient reduction mechanism reducing the net index of refraction gradients produced in the beam when the reflected pressure wave returns to the discharge region.

25. The apparatus of claim 22 further comprising:
the bandwidth stabilizer further comprises a refraction gradient reduction mechanism reducing the net index of refraction gradients produced in the beam when the reflected pressure wave returns to the discharge region.

26. The apparatus of claim 21 further comprising:
the bandwidth stabilizer further comprises a pressure wave impact reducer reducing the impact to the discharge region of the reflection of the pressure waves from the chamber walls.

27. The apparatus of claim 22 further comprising:
the bandwidth stabilizer further comprises a pressure wave impact reducer reducing the impact to the discharge region of the reflection of the pressure waves from the chamber wails.

28. The apparatus of claim 23 further comprising:
the bandwidth stabilizer further comprises a pressure wave impact reducer reducing the impact to the discharge region of the reflection of the pressure waves from the chamber walls.

29. The apparatus of claim 21 further comprising:
the bandwidth stabilizer further comprises a pressure wave impact reducer reducing the impact to the discharge region of the reflection of the pressure waves from one or more reflecting mechanisms within the chamber.

30. The apparatus of claim 22 further comprising:
the bandwidth stabilizer further comprises a pressure wave impact reducer reducing the impact to the discharge region of the reflection of the pressure waves from one or more reflecting mechanisms within the chamber.

31. The apparatus of claim 23 further comprising:
the bandwidth stabilizer further comprises a pressure wave impact reducer reducing the impact to the discharge region of the reflection of the pressure waves from one or more reflecting mechanisms within the chamber.

* * * * *